United States Patent
Kume et al.

(10) Patent No.: US 7,706,423 B2
(45) Date of Patent: Apr. 27, 2010

(54) DUAL-WAVELENGTH SEMICONDUCTOR LASER DEVICE AND METHOD FOR FABRICATING THE SAME

(75) Inventors: Masahiro Kume, Shiga (JP); Toru Takayama, Nara (JP); Shouichi Takasuka, Hyogo (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 27 days.

(21) Appl. No.: 12/166,703

(22) Filed: Jul. 2, 2008

(65) Prior Publication Data

US 2009/0074022 A1 Mar. 19, 2009

(30) Foreign Application Priority Data

Sep. 19, 2007 (JP) ............... 2007-242856

(51) Int. Cl.
*H01S 5/00* (2006.01)
*H01S 3/14* (2006.01)
(52) U.S. Cl. .................. 372/50.121; 372/68
(58) Field of Classification Search ............ 372/46.016, 372/49.01, 50.121, 68
See application file for complete search history.

(56) References Cited

U.S. PATENT DOCUMENTS

| 5,157,680 | A | 10/1992 | Goto |
| 6,771,586 | B2 * | 8/2004 | Fujii ........................ 369/121 |
| 7,045,810 | B2 * | 5/2006 | Tatsumi ..................... 257/14 |
| 2005/0008054 | A1 | 1/2005 | Ukai |
| 2005/0271108 | A1 * | 12/2005 | Wada et al. ............ 372/50.12 |
| 2007/0019698 | A1 | 1/2007 | Fukuhisa et al. |
| 2009/0034569 | A1 * | 2/2009 | Tanabe ................. 372/45.011 |

FOREIGN PATENT DOCUMENTS

JP 2004-349286 12/2004

* cited by examiner

*Primary Examiner*—Armando Rodriguez
(74) *Attorney, Agent, or Firm*—McDermott Will & Emery LLP (57) ABSTRACT

In a dual-wavelength semiconductor laser in which a first semiconductor laser element and a second semiconductor laser element are integrated onto a substrate made of a compound semiconductor, a constituent material of an etching stopper of the first semiconductor laser element is a material which allows diffusion of impurities less easily than a constituent material of an etching stopper of the second semiconductor laser element.

15 Claims, 5 Drawing Sheets

DUAL-WAVELENGTH SEMICONDUCTOR LASER DEVICE AND METHOD FOR FABRICATING THE SAME

BACKGROUND OF THE INVENTION

1. Field of the Invention

The present invention relates to a semiconductor laser device, in particular to a dual-wavelength semiconductor laser device having two semiconductor lasers formed on a common semiconductor substrate and to a method for fabricating the same.

2. Description of the Prior Art

Today, a semiconductor laser device is widely used in various fields. Especially in recent years, a dual-wavelength semiconductor laser device having two semiconductor laser elements which have different oscillation wavelengths and are formed on a common semiconductor substrate has been in the limelight and has enjoyed a rapidly increasing demand as a light source of an optical pickup device for recording/playback of DVD and CD.

Figure 7:
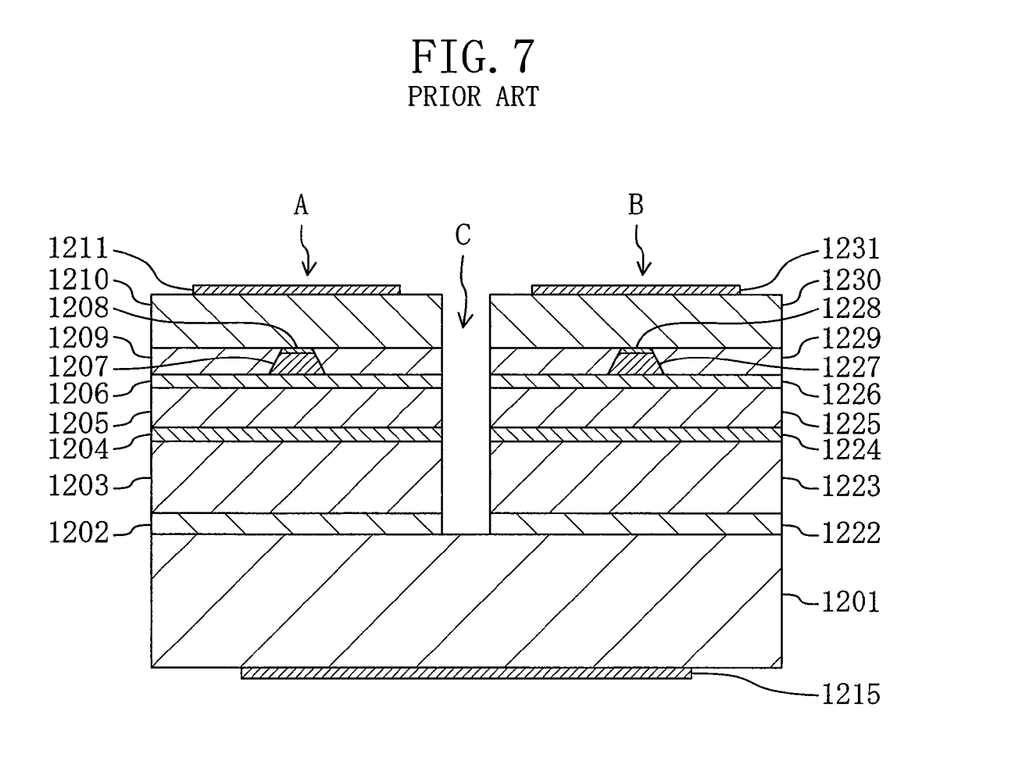
FIG. 7 is a cross-sectional view showing a configuration of a conventional dual-wavelength semiconductor laser device.

An example of a conventional dual-wavelength semiconductor laser device having two semiconductor laser elements is shown in FIG. 7 (see Japanese Published Unexamined Patent Application No. 2004-349286). FIG. 7 shows a configuration of a monolithic dual-wavelength semiconductor laser device having an infrared laser element A for emitting light in a band of 780 nm and a red laser element B for emitting light in a band of 650 nm on a common substrate. The infrared laser element A and the red laser element B are separated from each other by a separation groove C which reaches the substrate.

First, a structure of the infrared laser element A will be described.

The infrared laser element A includes an N-type buffer layer 1202 made of GaAs (the amount of doped Si:$1.0 \times 10^{18}$ cm$^{-3}$), an N-type clad layer 1203 made of $(Al_{0.3}Ga_{0.7})_{0.5}In_{0.5}P$ (the amount of doped Si:$1.0 \times 10^{18}$ cm$^{-3}$), an undoped infrared active layer 1204, a P-type first clad layer 1205 made of $(Al_{0.3}Ga_{0.7})_{0.5}In_{0.5}P$ (the amount of doped Zn:$3 \times 10^{17}$ cm$^{-3}$), a P-type etching stopper 1206 made of $Ga_{0.5}In_{0.5}P$ (the amount of doped Zn:$1 \times 10^{18}$ cm$^{-3}$), a P-type second clad layer 1207 made of $(Al_{0.3}Ga_{0.7})_{0.5}In_{0.5}P$ (the amount of doped Zn:$1 \times 10^{18}$ cm$^{-3}$), and a P-type cap layer 1208 made of $Ga_{0.5}In_{0.5}P$ which are stacked in sequence from the underside on a substrate 1201 made of N-type GaAs. It is to be noted that, the N-type buffer layer 1202 is provided to improve the crystalline quality of the N-type clad layer 1203.

The P-type second clad layer 1207 is processed to have a striped ridge shape. On the P-type second clad layer 1207, the striped P-type cap layer 1208 is provided. Moreover, on both sides of the P-type second clad layer 1207, an N-type current block layer 1209 made of $Al_{0.5}In_{0.5}P$ (the amount of doped Si: $1.0 \times 10^{18}$ cm$^{-3}$) is provided. On the P-type cap layer 1208 and the N-type current block layer 1209, a contact layer 1210 made of P-type GaAs (the amount of doped Zn: $7 \times 10^{18}$ cm$^{-3}$) is provided. On an upper surface of the contact layer 1210, a P-side electrode 1211 is provided. On a lower surface of the substrate 1201, an N-side electrode 1215 is provided. To etch the P-type second clad layer 1207 for forming a ridge, the P-type etching stopper 1206 which is different from the P-type second clad layer 1207 in composition is provided. Using an etching process in which the etching rate of the etching stopper 1206 is considerably low allows the ridge to be formed with high dimensional accuracy.

Figure 8:
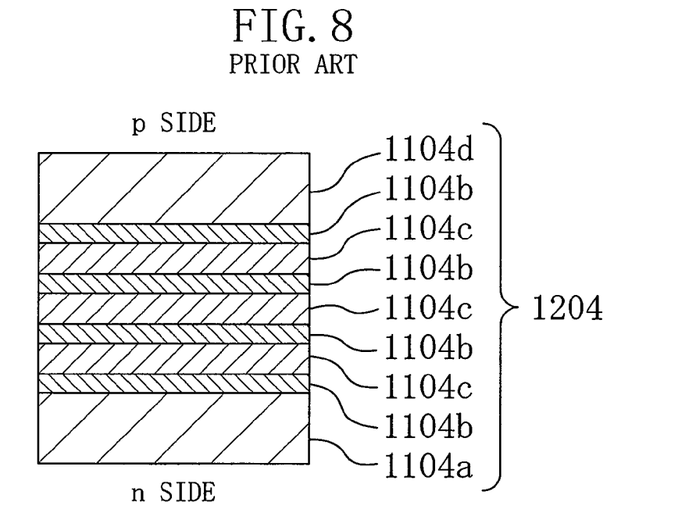
FIG. 8 is a cross-sectional view showing an active layer structure of an infrared laser of the conventional dual-wavelength semiconductor laser device.

FIG. 8 is a cross-sectional view showing a configuration of the infrared active layer 1204 of FIG. 7. As shown in the figure, the infrared active layer 1204 has a multiple quantum well structure composed of, in sequence from the underside (n side), a first optical guide layer 1104a made of undoped $Al_{0.4}Ga_{0.6}As$, a layered structure including a total of four well layers 1104b made of undoped GaAs and a total of three barrier layers 1104c made of undoped $Al_{0.4}Ga_{0.6}As$ which are alternately stacked, and a second optical guide layer 1104d made of undoped $Al_{0.4}Ga_{0.6}As$.

Next, a structure of the red laser element B will be described.

As shown in FIG. 7, the red laser element B includes an N-type buffer layer 1222 made of GaAs (the amount of doped Si:$1.0 \times 10^{18}$ cm$^{-3}$), an N-type clad layer 1223 made of $(Al_{0.3}Ga_{0.7})_{0.5}In_{0.5}P$ (the amount of doped Si: $1.0 \times 10^{18}$ cm$^{-3}$), an undoped red active layer 1224, a P-type first clad layer 1225 made of $(Al_{0.3}Ga_{0.7})_{0.5}In_{0.5}P$ (the amount of doped Zn:$5 \times 10^{17}$ cm$^{-3}$, an etching stopper 1226 made of $Ga_{0.5}In_{0.5}P$ (the amount of doped Zn:$1.0 \times 10^{18}$ cm$^{-3}$), a P-type second clad layer 1227 made of $(Al_{0.3}Ga_{0.7})_{0.5}In_{0.5}P$ (the amount of doped Zn:$1 \times 10^{18}$ cm$^{-3}$), and a P-type cap layer 1228 made of $Ga_{0.5}In_{0.5}P$ which are stacked in sequence from the underside on the substrate 1201. It is to be noted that, the N-type buffer layer 1222 is provided to improve the crystalline quality of the N-type clad layer 1223.

The P-type second clad layer 1227 is processed to have a striped ridge shape. On the P-type second clad layer 1227, the striped P-type cap layer 1228 is provided. Moreover, on both sides of the P-type second clad layer 1227, an N-type current block layer 1229 made of $Al_{0.5}In_{0.5}P$ (the amount of doped Si: $1.0 \times 10^{18}$ cm$^{-3}$) is provided. On the P-type cap layer 1228 and the N-type current block layer 1229, a P-type contact layer 1230 made of GaAs (the amount of doped Zn: $7 \times 10^{18}$ cm$^{-3}$) is provided. On an upper surface of the P-type contact layer 1230, a P-side electrode 1231 is provided. Also in the red laser element B, the etching stopper 1226 is different from the P-type second clad layer 1227 in composition, and a process is used in which etching is substantially stopped by the etching stopper 1226. This allows the ridge formation with good dimensional accuracy.

Figure 9:
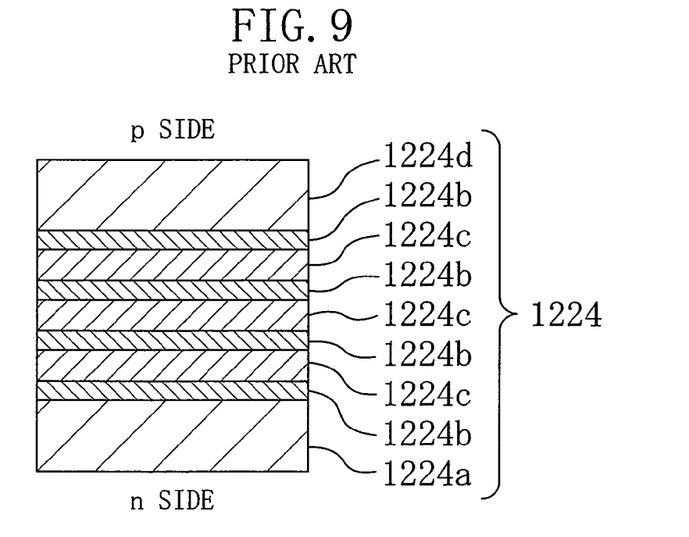
FIG. 9 is a cross-sectional view showing an active layer structure of a red laser of the conventional dual-wavelength semiconductor laser device.

FIG. 9 is a cross-sectional view showing a configuration of the red active layer 1224 of FIG. 7. As shown in the figure, the red active layer 1224 has a multiple quantum well structure composed of a first optical guide layer 1224a made of undoped $(Al_{0.5}Ga_{0.5})_{0.5}In_{0.5}P$, a layered structure formed by alternately stacking well layers 1224b made of undoped $Ga_{0.5}In_{0.5}P$ and barrier layers 1224c made of undoped $(Al_{0.5}Ga_{0.5})_{0.5}In_{0.5}P$, and a second optical guide layer 1224d made of undoped $(Al_{0.5}Ga_{0.5})_{0.5}In_{0.5}P$ which are stacked in sequence from the underside (n side).

A very important point in the fabrication of the conventional dual-wavelength semiconductor laser device is that the infrared laser structure is formed before the formation of the red laser structure. The reason is as follows. That is, in the red laser structure, the red active layer is made of a material containing P, for example, GaInP or AlGaInP. However, in these material films, the diffusion rate of Zn under a high temperature over 500° C. is greater than or equal to ten times as fast as in a material containing As, for example, GaAs or AlGaAs. Therefore, if the red laser structure is first formed, Zn diffuses from the P-type first clad layer 1225 and the P-type second clad layer 1227 of the red laser element into the red active layer 1224 in the subsequent crystal growth of the infrared laser structure, which may cause a change in band gap, and thus in oscillation wavelength.

SUMMARY OF THE INVENTION

In the above conventional example, both the infrared laser element and the red laser element have the etching stoppers made of $Ga_{0.5}In_{0.5}P$.

As described above, under a high temperature over 500° C. during crystal growth, the diffusion rate of a P-type dopant (for example, Zn) is much faster in a material containing P than in a material containing As. Therefore, the crystal growth of the red laser whose active layer contains P is performed after the crystal growth of the infrared laser whose active layer (contains As) does not contain P. However, in the conventional example, during the crystal growth of the red laser structure, Zn serving as a dopant diffuses from the P-type second clad layer 1207 containing P into the P-type first clad layer 1205 of the infrared laser whose crystal growth is performed first. This lowers the doping concentration and thus the carrier concentration of the P-type second clad layer 1207.

Here, the P-type second clad layer is a ridge portion of the laser structure, and the resistance of the ridge portion substantially determines the resistance of the semiconductor laser element. Therefore, when the carrier concentration of the P-type second clad layer lowers due to the diffusion of Zn, the resistance and the operating voltage greatly increase, causing the problem that the power supply limit of the laser drive circuit is exceeded.

Meanwhile, to suppress the Zn diffusion from the P-type second clad layer, the layers (the etching stopper and the P-type first clad layer) underlying the P-type second clad layer may be made of an As-based material. In this case, in the red laser having a short oscillation wavelength (660 nm), a sufficient band gap difference between the active layer and the layers made of As-based material can not be ensured, and thus injection carriers to the active layer overflow during high temperature operation, greatly increasing the operating current. Therefore, also in this case, the problem arises that the power supply limit of the laser drive circuit is exceeded.

An object of the present invention is to provide a dual-wavelength semiconductor laser device in which the occurrence of problems due to diffusion of a dopant is suppressed and a method for fabricating the same.

To solve the conventional problems, a dual-wavelength semiconductor laser device of the present invention includes a substrate, a first semiconductor laser element, and a second semiconductor laser element, the first semiconductor laser element and the second semiconductor laser element being provided on the substrate. The first semiconductor laser element includes a first clad layer of a first conductivity type formed over the substrate, a second clad layer of a second conductivity type formed above the first clad layer, a first active layer formed between the first clad layer and the second clad layer, a first etching stopper formed on the second clad layer, and a third clad layer of the second conductivity type formed on the first etching stopper. The second semiconductor laser element includes a fourth clad layer of the first conductivity type formed over the substrate, a fifth clad layer of the second conductivity type formed above the fourth clad layer, a second active layer formed between the fourth clad layer and the fifth clad layer, the second active layer generating light having a wavelength shorter than the wavelength of light generated by the first active layer, a second etching stopper formed on the fifth clad layer, and a sixth clad layer of the second conductivity type formed on the second etching stopper. In particular, the first etching stopper is made of a material which allows diffusion of impurities less likely than a material forming the second etching stopper.

With this configuration, impurities in the third clad layer hardly diffuse into the second clad layer. Therefore, it is possible to suppress a decrease of the carrier concentration of the third clad layer and thus the diffusion of the impurities into the first active layer. Therefore, even if the first semiconductor laser element is formed before the formation of the second semiconductor laser element, the problems are hardly caused in the first semiconductor laser element, which makes it possible to improve the fabrication yield of both the first semiconductor laser element and the second semiconductor laser element.

Specifically, it is preferable that the first etching stopper is made of $Al_xGa_{1-x}As$ ($0 \leq x \leq 1$), and the second etching stopper is made of $(Al_yGa_{1-y})_zIn_{1-z}P$ ($0 \leq y \leq 1$, $0 \leq z \leq 1$).

A method for fabricating a dual-wavelength semiconductor laser device of the present invention is a method for fabricating a dual-wavelength semiconductor laser device including: a first semiconductor laser element including a first clad layer of a first conductivity type, a second clad layer of a second conductivity type, a first active layer, a first etching stopper, and a third clad layer of the second conductivity type; and a second semiconductor laser element including a fourth clad layer of the first conductivity type, a fifth clad layer of the second conductivity type, a second active layer for generating light having a wavelength shorter than the wavelength of light generated by the first active layer, a second etching stopper, and a sixth clad layer of the second conductivity type, the method comprising the steps of: (a) forming the first clad layer, the first active layer, the second clad layer, the first etching stopper of a material which allows diffusion of impurities less easily than a material forming the second etching stopper, and the third clad layer from bottom to top over a substrate; (b) removing the first clad layer, the first active layer, the second clad layer, the first etching stopper, and the third clad layer by using a first mask formed on a part of the third clad layer to expose a part of the substrate; (c) after removing the first mask, forming the fourth clad layer, the second active layer, the fifth clad layer, the second etching stopper, and the sixth clad layer from bottom to top over the substrate; (d) removing portions of the fourth clad layer, the second active layer, the fifth clad layer, the second etching stopper, and the sixth clad layer which are formed over the third clad layer; and (e) removing a portion of the third clad layer and a portion of the sixth clad layer to form the third clad layer and the sixth clad layer into stripes.

With this method, it is possible to prevent the occurrence of the problems due to the diffusion of impurities even in the case where the diffusion rate of the impurities into the second active layer is grater than that of the impurities into the first active layer, because the first semiconductor laser element is formed before the formation of the second semiconductor laser element. Moreover, since the impurities in the third clad layer hardly diffuse via the first etching stopper into the second clad layer, it is possible to suppress, for example, a decrease of the impurity concentration of the third clad layer and the diffusion of the impurities into the first active layer.

As described above, according to the dual-wavelength semiconductor laser of the present invention, since the first etching stopper allows diffusion of impurities less easily than the second etching stopper, it is possible to prevent the impurities in the third clad layer from being diffused into the second clad layer. This can suppress a decrease of the carrier concentration of the third clad layer and prevent an increase of the resistance and the operating voltage of the first semiconductor laser element. For example, the first etching stopper is made of a compound semiconductor containing As, and an example of impurities of second conductivity type is Zn.

DESCRIPTION OF THE PREFERRED EMBODIMENTS

Embodiments of the present invention will be described below with reference to the drawings.

Embodiment 1

Figure 1:
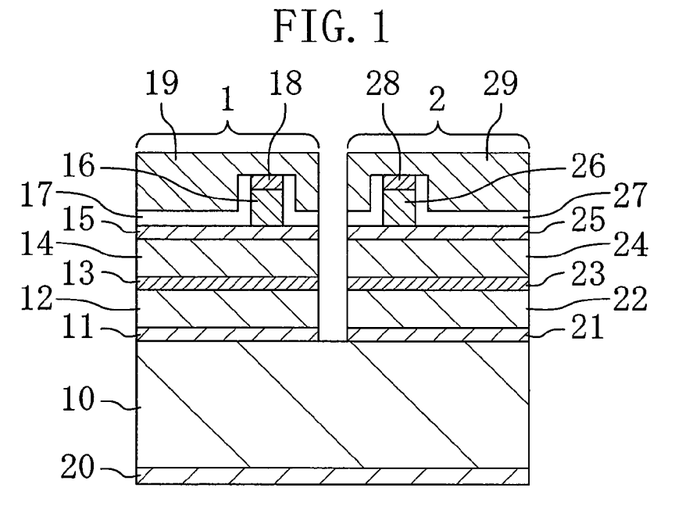
FIG. 1 is a cross-sectional view showing an example of a semiconductor laser device according to Embodiment 1 of the present invention.

FIG. 1 is a cross-sectional view showing an example of a semiconductor laser device according to Embodiment 1 of the present invention.

As shown in the figure, the semiconductor laser device of the present embodiment includes a first semiconductor laser element 1 for generating infrared light and a second semiconductor laser element 2 for generating red light which are formed on an N-type GaAs substrate 10 having, as the principal plane, a plane inclined from the (100) plane by 10° along the [011] direction.

The first semiconductor laser element 1 includes a buffer layer 11 made of N-type GaAs, an N-type clad layer 12 made of N-type (AlGa)InP, an active layer 13, a P-type first clad layer 14 made of P-type (AlGa)InP, and an etching stopper 15 made of AlGaAs which are formed in sequence from bottom to top on the N-type GaAs substrate 10. That is, the first semiconductor laser element 1 has a double heterostructure in which the active layer 13 is sandwiched between two clad layers (the N-type clad layer 12 and the P-type first clad layer 14).

Moreover, in the first semiconductor laser element 1, a P-type second clad layer 16 made of P-type (AlGa)InP forms a ridge having a mesa shape over the active layer 13. Further, a current block layer 17 made of N-type AlInP is formed to cover side surfaces of the ridge. On the P-type second clad layer 16, a contact layer 18 which is made of P-type GaAs and located in an upper portion of the ridge is provided. Furthermore, on the current block layer 17 and the contact layer 18, a P-side electrode 19 is provided. On a lower surface of the N-type GaAs substrate 10, an N-side electrode 20 is provided.

Figure 2:
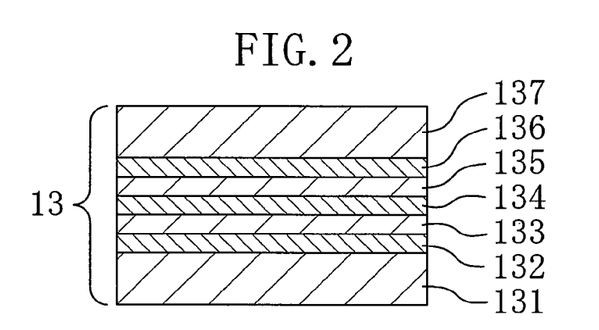
FIG. 2 is a cross-sectional view showing a configuration of an active layer of a first semiconductor laser element of FIG. 1.

FIG. 2 is a cross-sectional view showing a configuration of the active layer 13 of FIG. 1. As shown in the figure, the active layer 13 is a quantum well active layer composed of a first guide layer 131 made of AlGaAs, a first well layer 132 made of AlGaAs, a first barrier layer 133 made of AlGaAs, a second well layer 134 made of AlGaAs, a second barrier layer 135 made of AlGaAs, a third well layer 136 made of AlGaAs, and a second guide layer 137 made of AlGaAs which are arranged in sequence from the underside (n side). It is to be noted that, an example of the composition ratio of each of the above layers will be described later.

In the first semiconductor laser element 1, a current injected from the P-side electrode 19 is confined only to a ridge portion by the current block layer 17 made of N-type AlInP, so that the current injected in the active layer 13 is concentrated in a portion of the active layer 13 located close to a bottom of the ridge. Therefore, an inverted distribution state of carriers necessary for laser oscillation can be realized with an injection current of about several tens of mA. At this time, light generated through recombination of carriers is confined in the direction vertical to the principal surface of the active layer 13 by both the clad layers, that is, the N-type clad layer 12 and the P-type first clad layer 14. Moreover, the light is confined in the direction parallel to the principal surface of the active layer 13 by the current block layer 17 made of N-type AlInP whose refractive index is smaller than that of the P-type second clad layer 16 made of P-type (AlGa)InP. Therefore, the first semiconductor laser element 1 can be driven as a (ridge waveguide type) semiconductor laser element which uses a ridge as a waveguide and is capable of causing basic transverse mode oscillation. It is to be noted that, as the current block layer 17, a dielectric film such as of SiN can be used. That is, also in the case where the current block layer 17 is made of a dielectric material such as SiN, it is possible to realize the functions of confining a current to the ridge portion and confining light in the direction parallel to the principal surface of the active layer 13 to a portion of the active layer 13 located directly under the ridge portion for causing the basic transverse mode oscillation.

Next, a structure of the second semiconductor laser element 2 will be described.

As shown in FIG. 1, the second semiconductor laser element 2 includes a buffer layer 21 made of N-type GaAs, an N-type clad layer 22 made of N-type (AlGa)InP, an active layer 23, a P-type first clad layer 24 made of P-type (AlGa)InP, and an etching stopper 25 made of GaInP which are stacked in sequence from bottom to top on the N-type GaAs substrate 10. As described above, the second semiconductor laser element 2 has a double heterostructure in which the active layer 23 is sandwiched between two clad layers (the N-type clad layer 22 and the P-type first clad layer 24).

Moreover, the P-type second clad layer 26 made of P-type (AlGa)InP on the etching stopper 25 forms a ridge having a mesa shape above the active layer 23. Further, a current block layer 27 made of N-type AlInP is provided to cover side surfaces of the ridge. On the P-type second clad layer 26, a contact layer 28 which is made of P-type GaAs and located in an upper portion of the ridge is provided. Furthermore, on the current block layer 27 and the contact layer 28, a P-side electrode 29 is provided. The N-side electrode 20 is shared between the second semiconductor laser element 2 and the first semiconductor laser element 1.

Figure 3:
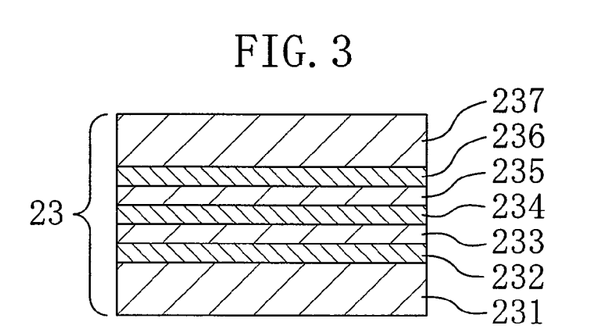
FIG. 3 is a cross-sectional view showing a configuration of an active layer of a second semiconductor laser element of FIG. 1.

FIG. 3 is a cross-sectional view showing a configuration of the active layer 23 of FIG. 1. As shown in the figure, the active layer 23 is a quantum well active layer composed of a first guide layer 231 made of (AlGa)InP, a first well layer 232 made of GaInP, a first barrier layer 233 made of (AlGa)InP, a second well layer 234 made of GaInP, a second barrier layer 235 made of (AlGa)InP, a third well layer 236 made of GaInP, and a second guide layer 237 made of (AlGa)InP which are arranged in sequence from the underside (n side).

In the second semiconductor laser element 2, a current injected from the P-side electrode 29 is confined by a ridge portion formed by the P-type second clad layer 26, which causes laser oscillation in a portion of the active layer 23 located directly under the ridge portion. As in the first semiconductor laser element 1, the current block layer 27 made of N-type AlInP can be formed of a dielectric material such as SiN.

Here, examples of the composition ratio and the thickness of each of the layers constituting the semiconductor laser device are given. In the first semiconductor laser element 1, the buffer layer 11 is made of N-type GaAs having a thickness of 0.5 μm, the N-type clad layer 12 is made of N-type $(Al_{0.7}Ga_{0.3})_{0.51}In_{0.49}P$ having a thickness of 3.0 μm, the P-type first clad layer 14 is made of P-type $(Al_{0.7}Ga_{0.3})_{0.51}In_{0.49}P$ having a thickness of 0.2 μm, the etching stopper 15 is made of P-type $Al_{0.6}Ga_{0.4}As$ having a thickness of 10 nm, the P-type second clad layer 16 is made of P-type $(Al_{0.7}Ga_{0.3})_{0.51}In_{0.49}P$ having a thickness of 1.5 μm, the current block layer 17 is made of N-type $Al_{0.51}In_{0.49}P$ having a thickness of 0.4 μm, and the contact layer 18 is made of P-type GaAs having a thickness of 0.2 μm.

Moreover, in the active layer 13, for example, the first guide layer 131 is made of $Al_{0.5}Ga_{0.5}As$ having a thickness of 10 nm, each of the first well layer 132, the second well layer 134, and the third well layer 136 is made of GaAs having a thickness of 3.5 nm, each of the first barrier layer 133 and the second barrier layer 135 is made of $Al_{0.5}Ga_{0.5}As$ having a thickness of 4 nm, and the second guide layer 137 is made of $Al_{0.5}Ga_{0.5}As$ having a thickness of 10 nm. The active layer 13 is not especially limited to the quantum well active layer as described in the above example. For example, the active layer 13 may be a quantum well active layer having two well layers or may be a bulk active layer. Moreover, the conductivity type of the active layer 13 is not especially limited. Generally, the active layer 13 is undoped. However, within the range where the number of vacancies serving as non-radiative recombination centers is sufficiently small, the active layer 13 can be P-type or N-type.

In the second semiconductor laser element 2, for example, the buffer layer 21 is made of N-type GaAs having a thickness of 0.5 μm, the N-type clad layer 22 is made of N-type $(Al_{0.7}Ga_{0.3})_{0.51}In_{0.49}P$ having a thickness of 2.5 μm, the P-type first clad layer 24 is made of P-type $(Al_{0.7}Ga_{0.3})_{0.51}In_{0.49}P$ having a thickness of 0.2 μm, the etching stopper 25 is made of P-type $Ga_{0.51}In_{0.49}P$ having a thickness of 10 nm, the P-type second clad layer 26 is made of P-type $(Al_{0.7}Ga_{0.3})_{0.51}In_{0.49}P$ having a thickness of 1.5 μm, the current block layer 27 is made of N-type $Al_{0.51}In_{0.49}P$ having a thickness of 0.4 μm, and the contact layer 28 is made of P-type GaAs having a thickness of 0.2 μm.

In the active layer 23, for example, the first guide layer 231 is made of $(Al_{0.5}Ga_{0.5})_{0.51}In_{0.49}P$ having a thickness of 50 nm, each of the first well layer 232, the second well layer 234, and the third well layer 236 is made of $Ga_{0.48}In_{0.52}P$ having a thickness of 5 nm, each of the first barrier layer 233 and the second barrier layer 235 is made of $(Al_{0.5}Ga_{0.5})_{0.51}In_{0.49}P$ having a thickness of 5 nm, and the second guide layer 237 is made of $(Al_{0.5}Ga_{0.5})_{0.51}In_{0.49}P$ having a thickness of 50 nm.

The active layer 23 is not especially limited to the strained quantum well active layer as described in the above example. For example, an unstrained quantum well active layer or a bulk active layer can be used. Moreover, the conductivity type of the active layer 23 is not especially limited. Generally, the active layer 23 is undoped. However, within the range where the number of vacancies serving as non-radiative recombination centers is sufficiently small, the active layer 23 can be P-type or N-type.

As to the impurity concentration, each of the N-type clad layers 12 and 22 contains Si at a concentration of $4 \times 10^{17}$ cm$^{-3}$, each of the P-type first clad layers 14 and 24 contains Zn at a concentration of $7 \times 10^{17}$ cm$^{-3}$, and each of the etching stoppers 15 and 25 and the P-type second clad layers 16 and 26 contains Zn at a concentration of $1 \times 10^{18}$ cm$^{-3}$.

Moreover, it is preferable that the etching stopper 15 made of $Al_xGa_{1-x}As$ has an Al composition x filling the following: x>0.2 which is the condition where a laser beam is not absorbed. Further, it is preferable that the lower limit of the thickness of each of the etching stoppers 15 and 25 is about 10 nm, and the upper limit of the thickness of each of the etching stoppers 15 and 25 is in such an extent that vertical light distribution is not greatly affected.

With reference to FIG. 4, steps for fabricating the semiconductor laser device according to Embodiment 1 will be described below.

Figure 4A:
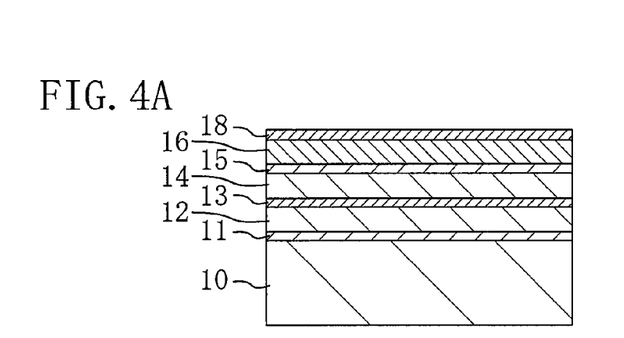
FIGS. 4A through 4F are cross-sectional views illustrating steps for fabricating the semiconductor laser device according to Embodiment 1.

First, as illustrated with FIG. 4A, over an N-type GaAs substrate 10, a buffer layer 11 made of N-type GaAs, an N-type clad layer 12 made of N-type (AlGa)InP, an active layer 13 having a multiple quantum well composed of GaAs/AlGaAs having an oscillation wavelength of 780 nm, a P-type first clad layer 14 made of P-type (AlGa)InP, an etching stopper 15 made of AlGaAs, a P-type second clad layer 16 made of P-type (AlGa)InP, and a contact layer 18 made of P-type GaAs are sequentially formed by MOCVD. It is to be noted that between the P-type second clad layer 16 and the contact layer 18, an interlayer made of, for example, P-type $Ga_{0.51}In_{0.49}P$ may be disposed to relax a heterobarrier.

Figure 4B:
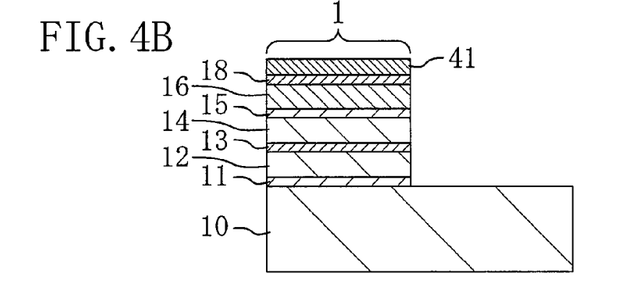

Then, as illustrated with FIG. 4B, an upper surface of the first semiconductor laser element 1 is covered with a resist film 41. Using the resist film 41 as a mask, wet etching is performed to remove all the layers lying between and including the contact layer 18 and the buffer layer 11. It is to be noted that to etch semiconductor layers containing P (the P-type second clad layer 16, the P-type first clad layer 14, and the N-type clad layer 12), a hydrochloric acid-based etchant is used, and to etch semiconductor layers containing As (the contact layer 18, the etching stopper 15, the active layer 13, and the buffer layer 11), a sulfuric acid-based etchant is used.

Figure 4C:
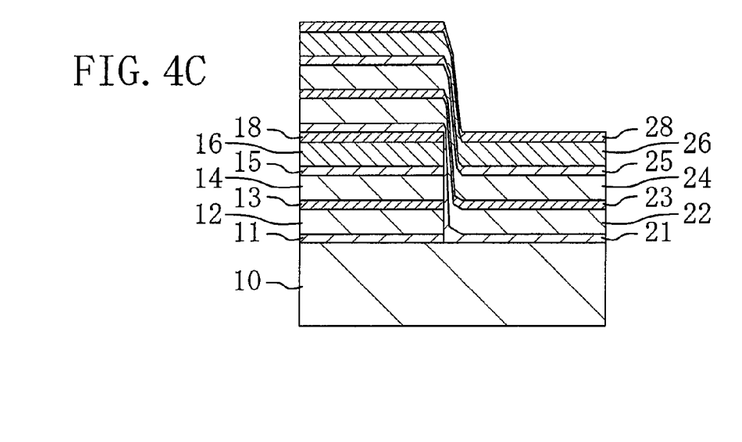

Then, as illustrated with FIG. 4C, over the first semiconductor laser element 1 from which the resist film 41 has been removed and over an upper surface of the N-type GaAs substrate 10, a buffer layer 21 made of N-type GaAs, an N-type clad layer 22 made of N-type (AlGa)InP, an active layer 23 having a multiple quantum well structure having an oscillation wavelength of 660 nm, a P-type first clad layer 24 made of P-type (AlGa)InP, an etching stopper 25 made of GaInP, a P-type second clad layer 26 made of P-type (AlGa)InP, and a contact layer 28 made of P-type GaAs are sequentially formed by MOCVD. It is to be noted that between the P-type second clad layer 26 and the contact layer 28, an interlayer made of, for example, P-type $Ga_{0.51}In_{0.49}P$ may be disposed to relax a heterobarrier. This is the same as in the infrared laser element.

Figure 4D:
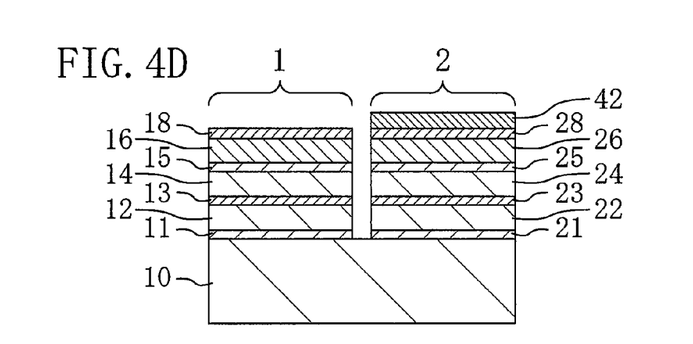

Then, as illustrated with FIG. 4D, an upper surface of the second semiconductor laser element 2 is covered with a resist film 42. Using the resist film 42 as a mask, wet etching is performed to remove all the layers lying between and including the contact layer 28 and the buffer layer 21. As in the first semiconductor laser element 1 serving as an infrared laser, using proper etchants allows layers containing P and layers containing As to be removed by wet etching. It is to be noted that the first semiconductor laser element 1 and the second semiconductor laser element 2 are formed with a predetermined space therebetween. Then, although not illustrated with the figures, the resist film 42 is removed, and then ZnO is deposited on the entire surface of the first semiconductor laser element 1 and the second semiconductor laser element 2 by sputtering and patterned such that the ZnO is left only in regions within about 20 μm from parts which are to be laser resonator end surfaces. Moreover, on the entire surface of the first semiconductor laser element 1 and the second semiconductor laser element 2 each including a ZnO film, a $SiO_2$ film is deposited. Then, a heat treatment is performed to diffuse Zn into the semiconductor layers directly under the ZnO films to disorder the active layers 13 and 23 for forming end surface window structures. When impurities an example of which is Zn are diffused into a multiple quantum well active layer, compositions of a well layer close to an end surface and a barrier layer are made uniform, which makes the band gap of the well layer close to the end surface wider than that before the diffusion of the impurities, so that a laser beam is no longer absorbed. When the window structure is used for a laser resonator end surface portion, a light emitting end surface is less likely to be damaged, so that a high-output semiconductor laser can be realized.

Figure 4E:
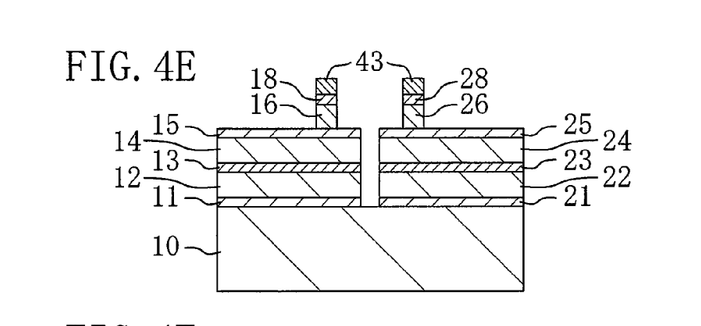

Then, as illustrated with FIG. 4E, the contact layer 18 and the P-type second clad layer 16 of the first semiconductor laser element 1 serving as an infrared laser and the contact layer 28 and the P-type second clad layer 26 of the second semiconductor laser element 2 serving as a red laser are formed into ridge waveguides.

First, a $SiO_2$ film 43 is deposited on the entire surface of the first semiconductor laser element 1 and the second semiconductor laser element 2 and then processed to be a striped mask pattern by photolithography and dry etching. Using the pattern as a mask, etching of the contact layers 18 and 28 and the P-type second clad layers 16 and 26 is performed, the etching proceeding up to the etching stoppers 15 and 25. The etching is performed by both of dry etching using a reactive ion plasma or the like and wet etching.

Figure 4F:
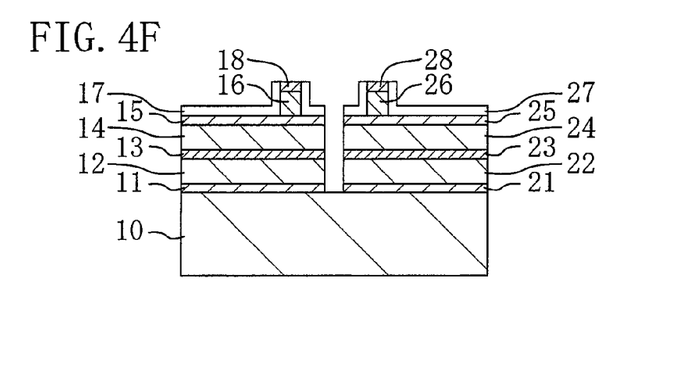

Finally, as illustrated with FIG. 4F, current block layers 17 and 27 made of N-type AlInP are formed to cover side surfaces of the ridge waveguides. When the current block layers are formed, the crystal growth of AlInP is performed by MOCVD with the $SiO_2$ film 43 being left. In this way, on the $SiO_2$ film 43, crystals of AlInP are not grown, but on the side surfaces of the waveguides and on upper surfaces of the etching stoppers 15 and 25, an AlInP layer is grown. When a dielectric film as of SiN or the like is used as the current block layers 17 and 27, the $SiO_2$ film 43 is removed by a fluorine-based etchant, and then a SiN film is deposited on the entire surface of the semiconductor laser device. After that, portions of the SiN film which are located on upper surfaces of the ridge waveguides are removed by photolithography and dry etching.

Although not illustrated with the figures, finally, over the contact layer 18 and the contact layer 28, P-side electrodes each having, for example, a Ti/Pt/Au layered structure are formed. Then, on a back surface of the N-type GaAs substrate 10, an N-side electrode having, for example, an AuGe/Ni/Au layered structure is formed to complete a dual-wavelength semiconductor laser device including the first semiconductor laser element 1 (infrared laser) and the second semiconductor laser element (red laser).

The dual-wavelength semiconductor laser device of the present invention is characterized in that the etching stopper of the infrared laser element whose crystal growth is first performed is made of a material which allows diffusion of impurities less easily than a material constituting the etching stopper of the red laser element which is to be formed later. For instance, in the example of the present embodiment, the etching stopper of the infrared laser element is made of an AlGaAs-based material, and the etching stopper of the red laser element is made of an AlGaInP-based material. Effects of the semiconductor laser device of the present embodiment will be described below with its characteristics being in comparison with those of the conventional semiconductor laser device.

Figure 5A:
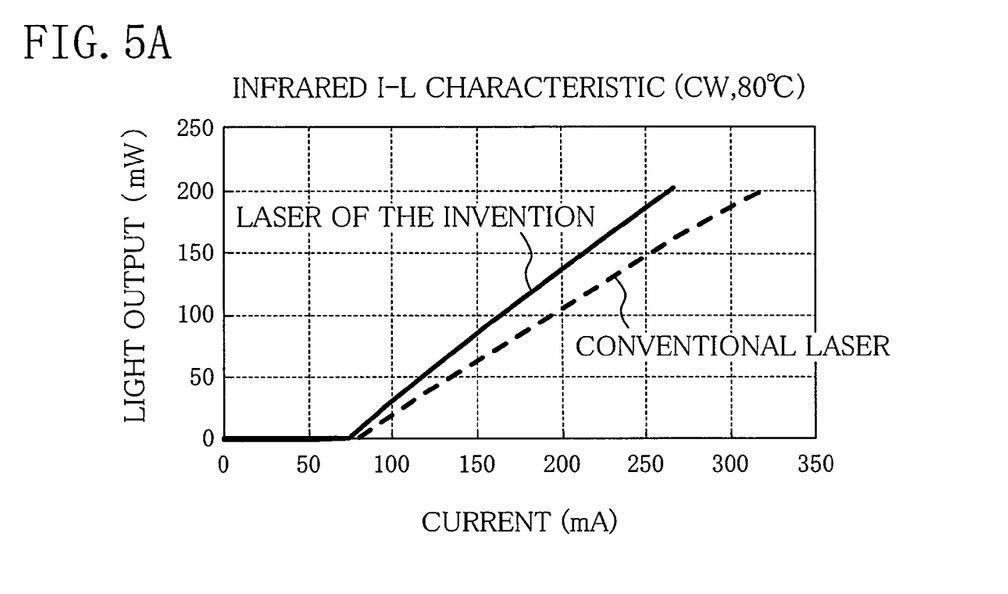
FIG. 5A is a view showing the I (current)-L (light output) characteristic of an infrared-side laser element of a dual-wavelength semiconductor laser device of the present invention in comparison with that of a conventional laser.
Figure 5B:
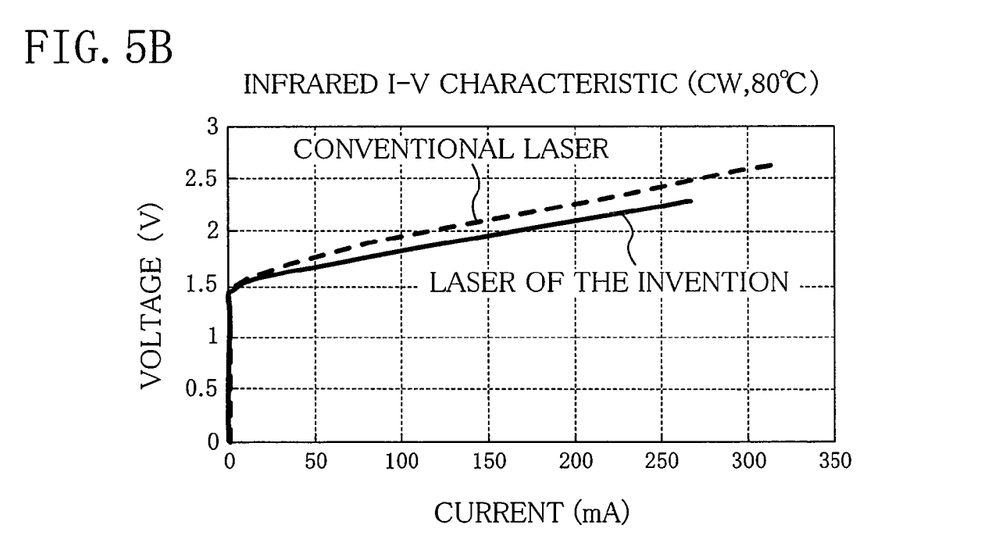
FIG. 5B is a view showing the I-V characteristic of the dual-wavelength laser device of the present invention in comparison with that of the conventional laser.

FIG. 5A is a view showing the I (current)-L (light output) characteristic of an infrared-side laser element of the dual-wavelength semiconductor laser device of the present invention in comparison with that of the conventional laser. FIG. 5B is a view showing the I-V characteristic of the dual-wavelength laser device of the present invention in comparison with that of the conventional laser.

During the crystal growth of the second semiconductor laser element serving as a red laser, Zn in the P-type second clad layer 16 (see FIG. 1) of the infrared laser (first semiconductor laser element) which is grown first diffuses toward the P-type first clad layer 14. If the etching stopper 15 is made of a P-based material, the diffusion proceeds toward the P-type first clad layer 14, which lowers the carrier concentration of the P-type second clad layer 16. As the carrier concentration is lowered, the resistance increases, and thus the drive voltage increases.

However, in the semiconductor laser device of the present embodiment, the etching stopper 15 is made of an As-based material. Therefore, the diffusion of Zn is suppressed by the etching stopper 15, and thus a decrease of the carrier concentration is smaller in the semiconductor laser device of the present embodiment than in the conventional laser. Therefore, as shown in FIG. 5B, the drive voltage is lower in the semiconductor laser device of the present embodiment than in the conventional laser. This reduces Joule heating in the first semiconductor laser element, suppressing a temperature rise of the laser element, which improves the I-L characteristic as shown in FIG. 5A. Moreover, Zn in the P-type first clad layer 14 diffuses also toward the active layer. Therefore, if Zn diffusion from the P-type second clad layer 16 into the P-type first clad layer 14 is great, Zn diffusion into the active layer is also great. When the Zn diffusion occurs, vacancies which are crystal defects are produced, and the produced vacancies are diffused, so that the vacancies are included in the active layer. It is known that defects such as the vacancies serve as non-radiative recombination centers, which lowers the luminous efficiency, causing an increase of the threshold value, a decrease in slope efficiency, and a deterioration in temperature characteristic. In the semiconductor laser device of the present embodiment, the Zn diffusion from the P-type second clad layer 16 to the P-type first clad layer 14 is suppressed, and thus the amount of Zn diffusing from the P-type first clad layer 14 to the active layer 13 is also reduced. Therefore, as shown in FIG. 5A, in the infrared laser element (first semiconductor laser element) of the present invention in which the etching stopper is made of an As-based material, the I-L characteristic at a high temperature is improved as compared with the conventional infrared laser element in which the etching stopper is made of a P-based material.

Another advantage of using an As-based material for the etching stopper of the first semiconductor laser element serving as an infrared laser element is found in the window structure formation by the Zn diffusion. When Zn is diffused from ZnO serving as a diffusion source into the resonator end surface portion to disorder the active layers, window structures are formed simultaneously for the infrared laser element (first semiconductor laser element) and the red laser element (second semiconductor laser element). The number of times where the infrared laser element whose crystal growth is first performed is subjected to a high temperature is greater than the number of times where the red laser element is subjected to a high temperature by one. Therefore, in the infrared laser element, the heat treatment after the deposition of ZnO further diffuses Zn, and thus the active layer of the infrared laser element is more strongly disordered than that of the red laser element. The window structure is necessary to prevent damage to an end surface caused by light, and generally, the red laser of short wavelength is more likely to cause damage to the end surface by its light. Therefore, in the conventional semiconductor laser device, if the heat treatment period is set such that the active layer of the red laser is sufficiently disordered, the active layer of the infrared laser element suffers too strong Zn diffusion and the crystalline quality deteriorates too much, so that the absorption of the laser beam occurs, which makes the window structure of the infrared laser element imperfect.

However, since in the semiconductor laser device of the present embodiment, the As-based etching stopper is used for the infrared laser element, the Zn diffusion is suppressed by the etching stopper 15, and thus it is possible to optimize the window structures of the infrared laser element and the red laser element with the same heat treatment period.

It is to be noted that the constituent materials of the etching stoppers 15 and 25 mentioned in the description above are mere examples. The etching stopper 15 may be made of $Al_xGa_{1-x}As$ ($0 \leq x \leq 1$), and the etching stopper 25 may be made of $(Al_yGa_{1-y})_zIn_{1-z}P$ ($0 \leq y \leq 1$, $0 \leq z \leq 1$).

Moreover, the constituent material of the P-type first clad layers 14 and 24 may be $(Al_aGa_{1-a})_bIn_{1-b}P$ ($0 \leq a \leq 1$, $0 \leq b \leq 1$). The constituent material of the P-type second clad layers 16 and 26 may be $(Al_cGa_{1-c})_dIn_{1-d}P$ ($0 \leq c \leq 1$, $0 \leq d \leq 1$).

Embodiment 2

Figure 6:
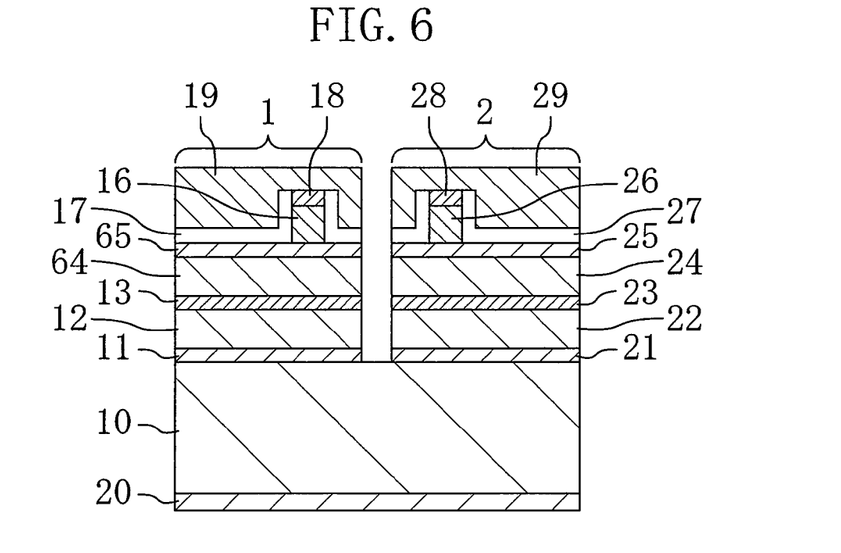
FIG. 6 is a cross-sectional view showing a semiconductor laser device according to Embodiment 2 of the present invention.

FIG. 6 is a cross-sectional view showing a semiconductor laser device according to Embodiment 2 of the present invention.

The semiconductor laser device of the present embodiment is different from the semiconductor laser device of Embodiment 1 in a P-type first clad layer 64 and an etching stopper 65 of a first semiconductor laser element 1. The other configurations of the semiconductor laser device of the present embodiment are the same as those of the first semiconductor laser device.

In the semiconductor laser device of the present embodiment, for example, the P-type first clad layer 64 has a composition of $Al_{0.6}Ga_{0.5}As$, a thickness of 0.2 μm, and a Zn concentration of $7 \times 10^{17}$ cm$^{-3}$. Moreover, the etching stopper 65 has a composition of $Al_{0.6}Ga_{0.4}As$, a thickness of 10 nm, and a Zn concentration of $1 \times 10^{18}$ cm$^{-3}$. The composition of the etching stopper 65 in this case is the same as that of the P-type first clad layer 64, and the etching stopper 65 is different from the P-type first clad layer 64 only in impurity concentration. However, the impurity concentration of the etching stopper 65 may be the same as that of the P-type first clad layer 64 so that the first semiconductor laser element 1 can be considered to have a structure substantially having no etching stopper. However, also in this case, in ridge waveguide formation etching, a P-based P-type second clad layer and an As-based P-type first clad layer can be etched selectively, and thus the semiconductor laser device can be fabricated in the same manner as in the case where the etching stopper is provided. It is to be noted that also in the semiconductor laser device of the present embodiment, the etching stopper 65 contains As, and thus the diffusion of Zn from the P-type second clad layer 16 into the P-type first clad layer 64 is suppressed.

The dual-wavelength semiconductor laser device of the present invention described above can be used widely as, for example, a light source of an optical information recording device requiring high power red and infrared laser beams and contributes to the downsizing of an apparatus equipped with laser devices.

What is claimed is:

1. A dual-wavelength semiconductor laser device comprising:
    a substrate;
    a first semiconductor laser element including a first clad layer of a first conductivity type formed over the substrate, a second clad layer of a second conductivity type formed above the first clad layer, a first active layer formed between the first clad layer and the second clad layer, a first etching stopper formed on the second clad layer, and a third clad layer of the second conductivity type formed on the first etching stopper; and
    a second semiconductor laser element including a fourth clad layer of the first conductivity type formed over the substrate, a fifth clad layer of the second conductivity type formed above the fourth clad layer, a second active layer formed between the fourth clad layer and the fifth clad layer, the second active layer generating light having a wavelength shorter than the wavelength of light generated by the first active layer, a second etching stopper formed on the fifth clad layer, and a sixth clad layer of the second conductivity type formed on the second etching stopper,
    wherein the first etching stopper is made of a material which allows diffusion of impurities less easily than a material forming the second etching stopper, and
    the second clad layer and the fifth clad layer are made of $(Al_aGa_{1-a})_bIn_{1-b}P(0 \leq a \leq 1, 0 \leq b \leq 1)$.

2. The dual-wavelength semiconductor laser device of claim 1, wherein
    the first etching stopper is made of $Al_xGa_{1-x}As(0 \leq x \leq 1)$, and
    the second etching stopper is made of $(Al_yGa_{1-y})_zIn_{1-z}P$ ($0 \leq y \leq 1$, $0 \leq z \leq 1$).

3. The dual-wavelength semiconductor laser device of claim 2, wherein the third clad layer and the sixth clad layer are made of $(Al_cGa_{1-c})_dIn_{1-d}P(0 \leq c \leq 1, 0 \leq d \leq 1)$.

4. The dual-wavelength semiconductor laser device of claim 1, wherein the first etching stopper and the second clad layer are made of compound semiconductors having the same composition.

5. The dual-wavelength semiconductor laser device of claim 1, wherein
the first active layer has a quantum well structure including $Al_eGa_{1-e}As(0 \leq e \leq 1)$, and
the second active layer has a quantum well structure including $(Al_fGa_{1-f})_gIn_{1-g}P(0 \leq f \leq 1, 0 \leq g \leq 1)$.

6. The dual-wavelength semiconductor laser device of claim 1, wherein light emitting end surface portions of the first active layer and the second active layer are disordered by the diffusion of the impurities.

7. A method for fabricating a dual-wavelength semiconductor laser device including:
a first semiconductor laser element including a first clad layer of a first conductivity type, a second clad layer of a second conductivity type, a first active layer, a first etching stopper, and a third clad layer of the second conductivity type; and
a second semiconductor laser element including a fourth clad layer of the first conductivity type, a fifth clad layer of the second conductivity type, a second active layer for generating light having a wavelength shorter than the wavelength of light generated by the first active layer, a second etching stopper, and a sixth clad layer of the second conductivity type,
the method comprising the steps of:
(a) forming the first clad layer, the first active layer, the second clad layer made of $(Al_aGa_{1-a})_bIn_{1-b}P(0 \leq a \leq 1, 0 \leq b \leq 1)$, the first etching stopper of a material which allows diffusion of impurities less easily than a material forming the second etching stopper, and the third clad layer from bottom to top over a substrate;
(b) removing the first clad layer, the first active layer, the second clad layer, the first etching stopper, and the third clad layer by using a first mask formed on a part of the third clad layer to expose a part of the substrate;
(c) after removing the first mask, forming the fourth clad layer, the second active layer, the fifth clad layer made of $(Al_aGa_{1-a})_bIn_{1-b}P(0 \leq a \leq 1, 0 \leq b \leq 1)$, the second etching stopper, and the sixth clad layer from bottom to top over the substrate;
(d) removing portions of the fourth clad layer, the second active layer, the fifth clad layer, the second etching stopper, and the sixth clad layer which are formed over the third clad layer; and
(e) removing a portion of the third clad layer and a portion of the sixth clad layer to form the third clad layer and the sixth clad layer into stripes.

8. The method of claim 7, wherein
the first etching stopper is made of $Al_xGa_{1-x}As(0 \leq x \leq 1)$, and
the second etching stopper is made of $(Al_yGa_{1-y})_zIn_{1-z}P (0 \leq y \leq 1, 0 \leq z \leq 1)$.

9. A dual-wavelength semiconductor laser device comprising:
a substrate;
a first semiconductor laser element including a first clad layer of a first conductivity type formed over the substrate, a second clad layer of a second conductivity type formed above the first clad layer, a first active layer formed between the first clad layer and the second clad layer, a first etching stopper formed on the second clad layer, and a third clad layer of the second conductivity type formed on the first etching stopper; and
a second semiconductor laser element including a fourth clad layer of the first conductivity type formed over the substrate, a fifth clad layer of the second conductivity type formed above the fourth clad layer, a second active layer formed between the fourth clad layer and the fifth clad layer, the second active layer generating light having a wavelength shorter than the wavelength of light generated by the first active layer, a second etching stopper formed on the fifth clad layer, and a sixth clad layer of the second conductivity type formed on the second etching stopper,
wherein the first etching stopper is made of a material which allows diffusion of impurities less easily than a material forming the second etching stopper, and
the third clad layer and the sixth clad layer are made of $(Al_cGa_{1-c})_dIn_{1-d}P(0 \leq c \leq 1, 0 \leq d \leq 1)$.

10. The dual-wavelength semiconductor laser device of claim 9, wherein
the first etching stopper is made of $Al_xGa_{1-x}As(0 \leq x \leq 1)$, and
the second etching stopper is made of $(Al_yGa_{1-y})_zIn_{1-z}P (0 \leq y \leq 1, 0 \leq z \leq 1)$.

11. The dual-wavelength semiconductor laser device of claim 9, wherein the first etching stopper and the second clad layer are made of compound semiconductors having the same composition.

12. The dual-wavelength semiconductor laser device of claim 9, wherein
the first active layer has a quantum well structure including $Al_eGa_{1-e}As(0 \leq e \leq 1)$, and
the second active layer has a quantum well structure including $(Al_fGa_{1-f})_gIn_{1-g}P(0 \leq f \leq 1, 0 \leq g \leq 1)$.

13. The dual-wavelength semiconductor laser device of claim 9, wherein light emitting end surface portions of the first active layer and the second active layer are disordered by the diffusion of the impurities.

14. A method for fabricating a dual-wavelength semiconductor laser device including:
a first semiconductor laser element including a first clad layer of a first conductivity type, a second clad layer of a second conductivity type, a first active layer, a first etching stopper, and a third clad layer of the second conductivity type; and
a second semiconductor laser element including a fourth clad layer of the first conductivity type, a fifth clad layer of the second conductivity type, a second active layer for generating light having a wavelength shorter than the wavelength of light generated by the first active layer, a second etching stopper, and a sixth clad layer of the second conductivity type,
the method comprising the steps of:
(a) forming the first clad layer, the first active layer, the second clad layer, the first etching stopper of a material which allows diffusion of impurities less easily than a material forming the second etching stopper, and the third clad layer made of $(Al_cGa_{1-c})_dIn_{1-d}P(0 \leq c \leq 1, 0 \leq d \leq 1)$ from bottom to top over a substrate;
(b) removing the first clad layer, the first active layer, the second clad layer, the first etching stopper, and the third clad layer by using a first mask formed on a part of the third clad layer to expose a part of the substrate;
(c) after removing the first mask, forming the fourth clad layer, the second active layer, the fifth clad layer, the second etching stopper, and the sixth clad layer made of $(Al_cGa_{1-c})_dIn_{1-d}P(0 \leq c \leq 1, 0 \leq d \leq 1)$ from bottom to top over the substrate;

(d) removing portions of the fourth clad layer, the second active layer, the fifth clad layer, the second etching stopper, and the sixth clad layer which are formed over the third clad layer; and
(e) removing a portion of the third clad layer and a portion of the sixth clad layer to form the third clad layer and the sixth clad layer into stripes.

15. The method of claim 14, wherein the first etching stopper is made of $Al_xGa_{1-x}As(0\leq x\leq 1)$, and the second etching stopper is made of $(Al_yGa_{1-y})_zIn_{1-z}P(0\leq y\leq 1, 0\leq z\leq 1)$.

* * * * *